(12) United States Patent
Kushnir

(10) Patent No.: US 12,021,959 B2
(45) Date of Patent: Jun. 25, 2024

(54) SIGNAL DISTORTION CORRECTION WITH TIME-TO-DIGITAL CONVERTER (TDC)

(71) Applicant: Mellanox Technologies, Ltd., Yokneam Illit (IL)

(72) Inventor: Igal Kushnir, Hod Hasharon (IL)

(73) Assignee: Mellanox Technologies, Ltd., Yokneam (IL)

( * ) Notice: Subject to any disclaimer, the term of this patent is extended or adjusted under 35 U.S.C. 154(b) by 133 days.

(21) Appl. No.: 17/731,651

(22) Filed: Apr. 28, 2022

(65) Prior Publication Data

US 2023/0353338 A1    Nov. 2, 2023

(51) Int. Cl.
*H04L 7/00* (2006.01)
*G04F 10/00* (2006.01)
*H03K 3/017* (2006.01)
*H04L 25/00* (2006.01)
*H04L 25/40* (2006.01)

(52) U.S. Cl.
CPC .......... *H04L 7/0016* (2013.01); *G04F 10/005* (2013.01); *H03K 3/017* (2013.01)

(58) Field of Classification Search
CPC .... H04L 7/0016; H03K 3/017; H03K 5/1565; G04F 10/005

USPC .......................................... 375/285, 346, 371
See application file for complete search history.

(56) References Cited

U.S. PATENT DOCUMENTS 8,644,085 B2 * 2/2014 Kim ...................... H03K 5/1565
 365/194
8,664,992 B2 * 3/2014 Ma ....................... H03K 5/1565
 327/175

* cited by examiner

*Primary Examiner* — Phuong Phu
(74) *Attorney, Agent, or Firm* — Lowenstein Sandler LLP

(57) ABSTRACT

A system includes a first device, coupled to a link, which transmits a signal having a repeating pattern on one or more paths of the link. The system includes a second device coupled to the link and including one or more circuits and a time-to-digital converter (TDC). The second device is to receive at the one or more circuits the signal. The second device is to determine, by the TDC, a current duty cycle of the signal, the current duty cycle having a first duration associated with a first portion of the signal and a second duration associated with a second portion of the signal. The second device is further to determine the current duty cycle fails to satisfy a condition associated with a target duty cycle in response to determining the current duty cycle of the signal and adjust the current duty cycle to obtain an adjusted duty cycle.

20 Claims, 7 Drawing Sheets

SIGNAL DISTORTION CORRECTION WITH TIME-TO-DIGITAL CONVERTER (TDC)

TECHNICAL FIELD

At least one embodiment pertains to processing resources used to perform and facilitate high-speed communications. For example, at least one embodiment pertains to technology for signal distortion correction with a time-digital-converter (TDC) in a serializer/deserializer (SerDes) system.

BACKGROUND

Communication systems transmit signals from a transmitter to a receiver via a communication channel or medium (e.g., cables, printed circuit boards, links, wirelessly, etc.) Signal distortion may occur when a signal is communicated from the transmitter to the receiver over the communication channel. This can cause inaccurate sampling of the signal at a sampler of the receiver that deserializes data associated with the signal—e.g., the receiver can erroneously determine a wrong logic state based on the distortion. Signal distortion correction can be performed to ensure that data is reliably communicated when communicating chip to chip (C2C) or in a serializer/deserializer (SerDes) system. Conventional methods can include asynchronous statistical sampling in which data symbols are sampled with an asynchronous sampling clock. This method can include generating an additional clock signal and routing it through the device to sample asynchronously, increasing complexity in the system. Other conventional methods can include analog filtering of clock signals in which an average value of the signal is determined. Such a method can be sensitive to system noise and utilize additional circuitry, reducing the area for memory storage.

BRIEF DESCRIPTION OF DRAWINGS

Various embodiments in accordance with the present disclosure will be described with reference to the drawings, in which.

DETAILED DESCRIPTION

Figure 1:
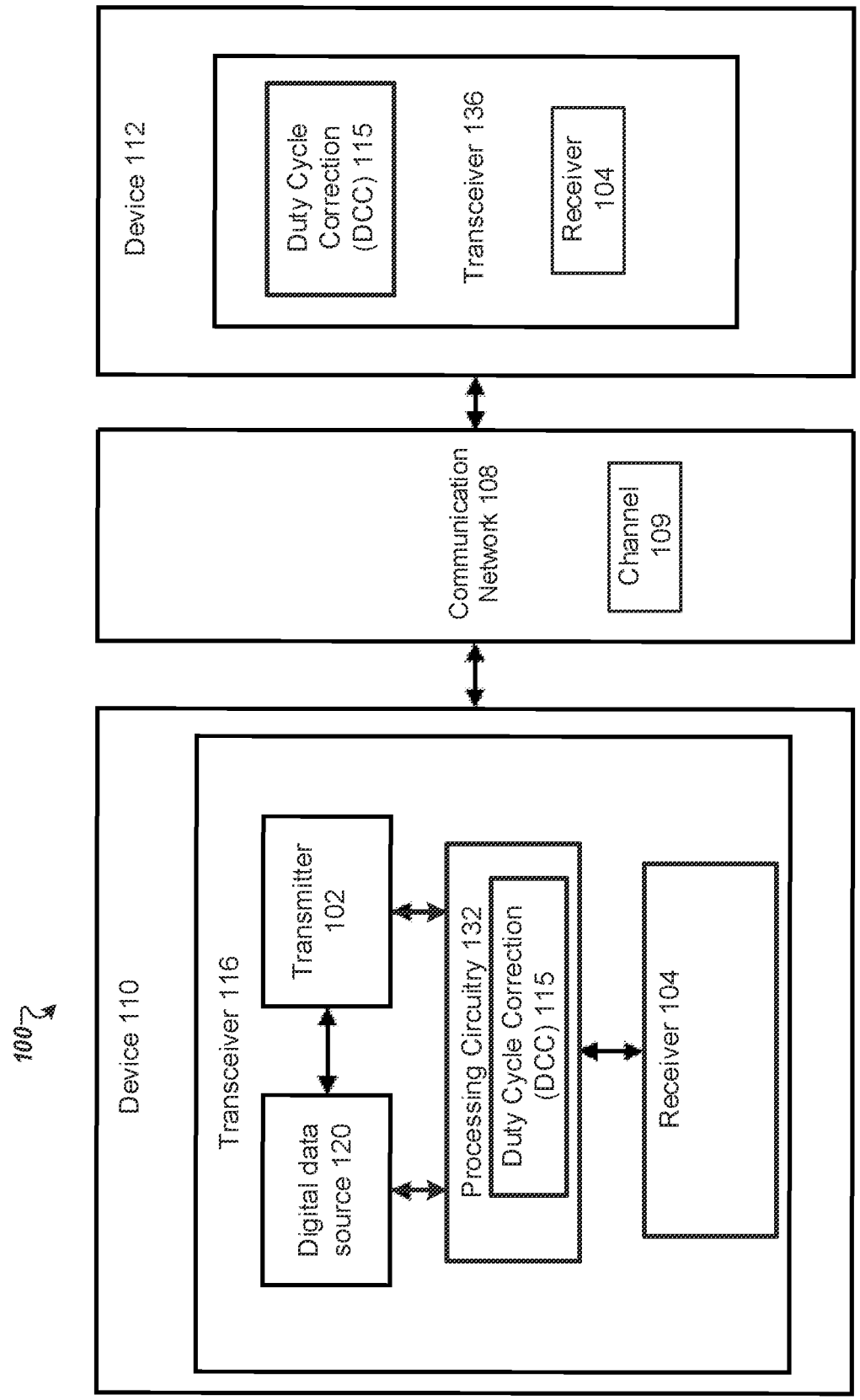
FIG. 1 is an example communication system, in accordance with at least some embodiments.

Communication systems transmit signals from a transmitter to a receiver via a communication channel or medium (e.g., cables, printed circuit boards, links, wirelessly, etc.). For example, the communication system can be an example of a serializer/deserializer (SerDes) system where data is serialized at the transmitter and deserialized at the receiver. Some communication systems can also transmit the symbols utilizing a modulation scheme—e.g., modulate symbols utilizing non-return-to-zero (NRZ), pulse amplitude modulation 2-level (PAM2), pulse amplitude modulation 4-level (PAM4), etc. To ensure the signal is reliably communicated, the receiver can sample each symbol in a middle of a symbol boundary—e.g., to increase link margin or link reliability, the receiver can sample symbols in the middle of the symbol boundary. The communication system can include circuitry components (e.g., analog circuitry, drivers, inverters, complementary metal-oxide-semiconductor (CMOS) devices, etc.) to communicate signals and data symbols between the transmitter and receiver via the communication channel. As the signal is driven through the circuitry components, the signal can be distorted and cause the symbol to be sampled at a position other than the middle of the symbol boundary—e.g., link margin or link reliability can be reduced when the signal is distorted. For example, the circuitry components at either the transmitter or receiver can introduce pulse width distortion. In such instances, symbols sampled at the receiver can have different widths. Accordingly, even if the symbols received are sampled at a constant rate, the pulse width can cause some symbols to be sampled closer to the edge, reducing link reliability. For example, strengths of a p-channel metal-oxide-semiconductor (PMOS) or an n-channel metal-oxide-semiconductor (NMOS) in a CMOS can be different, causing different rise and fall times for a data signal generated. The different rise and fall times can cause pulse width distortion. The signal can also be distorted in some communication systems due to duty cycle distortion. The duty cycle can refer to a ratio of time a circuit or signal is on compared to a time the circuit or signal is off—e.g., a clock signal is on or off during a given clock cycle. Due to the manufacturing process, a communication system can have a wide range of duty cycles—e.g., the system can have a duty cycle of 30%, 40%, 50%, 60%, etc. Signal distortion can occur when the duty cycle is not 50%—e.g., a clock signal operating at a double data rate (DDR) may transmit a logic state "1" longer or shorter than a duration associated with transmitting a logic state "0" during a respective clock cycle. This can cause signals to be sampled at a place other than the middle and reduce link reliability and link margin.

Communication systems can perform signal distortion correction to reduce signal distortion and improve link reliability and margin. Some conventional systems can perform asynchronous statistical sampling. In such systems, data symbols are sampled with a second asynchronous sampling clock. For example, the second asynchronous sampling clock can have a higher frequency than a clock signal associated with sampling data. Accordingly, the fast frequency asynchronous sampling clock a large amount of times during the clock cycle. The output is fed to a counter, and a number of '1's and '0's in a clock cycle is determined. The system can utilize the information from the counter to correct signal distortion. However, such methods can introduce additional complexity to the system in order to swap between the use of the sampling clock and the asynchronous clock. The methods can also reduce the available area within the system by including additional routing and circuitry for generating the asynchronous clock. Other conventional systems can perform analog filtering to reduce signal distortion. In such systems, a resistor-capacitor (RC circuit) can be used to filter an incoming signal. An average value (e.g., average voltage value compared with a reference voltage) is determined e.g., if the average value is below the reference voltage, the system can assume the duty cycle is lower than if the average value is above the reference voltage. According to the measurements, the system can adjust the system's duty cycle. However, the RC filter can be relatively large in such systems and take up an area that could otherwise be used for data storage or data transfer. Additionally, the measured average value or reference voltage can be affected by supply noise (e.g., offset of the analog-to-digital converter (ADC) or operational amplifier (opamp)) and cause inaccurate readings.

Advantageously, aspects of the present disclosure can address the deficiencies above and other challenges by providing a system and a method for performing signal distortion correction via a time-to-digital converter (TDC). In some embodiments, the TDC can be self-triggering—e.g., both a start and stop input of the TDC can originate from the same signal. In some examples, the TDC can determine a duration of a first portion of the signal relative to a duration of a second portion of the signal (e.g., determine the signal's duty cycle), and the communication system can utilize the information to adjust the duty cycle. Specifically, a signal that is either transmitted or is received can be fed into the TDC. The signal can be fed into a first path (e.g., portion or part of the TDC associated with the start input) and delayed via one or more delay components. Each delay component can generate a new delayed signal. The TDC can also invert the signal received and use the inverted signal to sample the signal and each delayed signal generated at a respective delay component and store the sample at a respective flip-flop. Because the signal is delayed and the inverted signal samples the signal at the rising edge, the TDC can determine a duration of the first portion of the signal during a clock cycle based on when the samples stored transition states—e.g., go from '1' to '0'. After determining the first duration, the TDC can swap a polarity of the signal to generate a second signal—e.g., invert the signal that is fed into the first path. The TDC can then delay the second signal and sample the second signal and second delayed signals with the inverted signal. As the polarity was swapped and the second signal is still sampled at a rising edge of the inverted clock signal, the TDC can determine the second duration of the signal during a clock cycle based on when the samples stored transition states—e.g., go from '0' to '1.' Because the TDC determines the durations of the first portion and second portion relative to each other, the exact duration in seconds is not calculated—e.g., the TDC can determine the duration of the first portion is five delay components or five τ and the second portion is six delay components or six τ. The TDC can output the durations of the first portion and second portion to a controller or firmware coupled with the TDC. In some embodiments, the controller can be a finite state machine. The controller or firmware can determine if the duration of the first portion matches the duration of the second portion. If they do not, the controller and firmware can send a control signal to adjust the duty cycle of the system. For example, the control signal can indicate to couple an additional PMOS or NMOS device to the output of a CMOS device or add a voltage to a clock signal line to have the signal sliced differently. The system can repeat this process (e.g., measure the duty cycle with the TDC and adjust) until the first portion and the second portion are the same—e.g., the duty cycle is 50%.

The system can avoid complex circuitry or take up too much area on a substrate by utilizing the TDC. Additionally, as there is a limited range for an initial duty cycle value, there is a limited number of steps or corrections before the first portion and the second portion are the same. Accordingly, improved signal distortion correction is described herein.

FIG. 1 illustrates an example communication system 100 according to at least one example embodiment. The system 100 includes a device 110, a communication network 108 including a communication channel 109, and a device 112. In at least one embodiment, devices 110 and 112 are two end-point devices in a computing system, such as a central processing unit (CPU) or graphics processing unit (GPU). In at least one embodiment, devices 110 and 112 are two servers. In at least one example embodiment, devices 110 and 112 correspond to one or more of a Personal Computer (PC), a laptop, a tablet, a smartphone, a server, a collection of servers, or the like. In some embodiments, the devices 110 and 112 may correspond to any appropriate type of device that communicates with other devices connected to a common type of communication network 108. According to embodiments, the receiver 104 of devices 110 or 112 may correspond to a GPU, a switch (e.g., a high-speed network switch), a network adapter, a CPU, a memory device, an input/output (I/O) device, other peripheral devices or components on a system-on-chip (SoC), or other devices and components at which a signal is received or measured, etc. As another specific but non-limiting example, the devices 110 and 112 may correspond to servers offering information resources, services, and/or applications to user devices, client devices, or other hosts in the system 100.

In one specific but non-limiting example, the communication network 108 is a network that enables data transmission between the devices 110 and 112 using data signals (e.g., digital, optical, wireless signals). Examples of the communication network 108 that may be used to connect the devices 110 and 112 include an Internet Protocol (IP) network, an Ethernet network, an InfiniBand (IB) network, a Fibre Channel network, the Internet, a cellular communication network, a wireless communication network, a ground referenced signaling (GRS) link, combinations thereof (e.g., Fibre Channel over Ethernet), variants thereof, and/or the like. In some embodiments, the communication network 108 can include one or more paths associated with transmitting data and one or more paths associated with transmitting a clock signal.

The device 110 includes a transceiver 116 for sending and receiving signals, for example, data signals. The data signals may be digital or optical signals modulated with data or other suitable signals for carrying data.

The transceiver 116 may include a digital data source 120, a transmitter 102, a receiver 104, and processing circuitry 132 that controls the transceiver 116. The digital data source 120 may include suitable hardware and/or software for outputting data in a digital format (e.g., in binary code and/or thermometer code). The digital data output by the digital data source 120 may be retrieved from memory (not illustrated) or generated according to input (e.g., user input).

The transmitter 102 includes suitable software and/or hardware for receiving digital data from the digital data source 120 and outputting data signals according to the digital data for transmission over the communication network 108 to a receiver 104 of device 112. Additional details of the structure of the transmitter 102 are discussed in more detail below with reference to the figures.

The receiver 104 of device 110 and 112 may include suitable hardware and/or software for receiving signals, such as data signals from the communication network 108. For example, the receiver 104 may include components for receiving processing signals to extract the data for storing in a memory, as described in detail below with respect to FIG. 2-FIG. 6.

The processing circuitry 132 may comprise software, hardware, or a combination thereof. For example, the processing circuitry 132 may include a memory including executable instructions and a processor (e.g., a microprocessor) that executes the instructions on the memory. The memory may correspond to any suitable type of memory device or collection of memory devices configured to store instructions. Non-limiting examples of suitable memory devices that may be used include Flash memory, Random Access Memory (RAM), Read Only Memory (ROM), variants thereof, combinations thereof, or the like. In some embodiments, the memory and processor may be integrated into a common device (e.g., a microprocessor may include integrated memory). Additionally or alternatively, the processing circuitry 132 may comprise hardware, such as an application-specific integrated circuit (ASIC). Other non-limiting examples of the processing circuitry 132 include an Integrated Circuit (IC) chip, a Central Processing Unit (CPU), a General Processing Unit (GPU), a microprocessor, a Field Programmable Gate Array (FPGA), a collection of logic gates or transistors, resistors, capacitors, inductors, diodes, or the like. Some or all of the processing circuitry 132 may be provided on a Printed Circuit Board (PCB) or collection of PCBs. It should be appreciated that any appropriate type of electrical component or collection of electrical components may be suitable for inclusion in the processing circuitry 132. The processing circuitry 132 may send and/or receive signals to and/or from other elements of the transceiver 116 to control the overall operation of the transceiver 116.

In some examples, processing circuitry 132 can include duty cycle correction (DCC) 115. In an embodiment, DCC 115 can be configured to determine a duty cycle of data signals or clock signals communicated between device 110 and device 112. In at least one embodiment, the DCC 115 can include a self-triggering time-to-digital converter (TDC) to determine a duration associated with a first portion of the signal and a duration associated with a second portion of the signal—e.g., the DCC 115 can include the self-triggering TDC to determine the duty cycle. In at least one embodiment, the DCC 115 can include logic (e.g., a controller) or use firmware to compare the duration of the first portion with the duration of the second portion. If the duration of the first portion is the same as the duration of the second portion of the signal, the DCC 115 can refrain from taking additional action. If the duration of the first portion of the signal is different than the duration of the second portion of the signal, the DCC 115 can transmit a control signal to a DCC component and adjust the duty cycle. The DCC 115 can continue determining the duty cycle and adjusting the duty cycle until the duration of the first portion matches the duration of the second portion—e.g., until the duty cycle is 50%. Additional details regarding the DCC 115 are described with reference to FIGS. 2-4.

The transceiver 116 or selected elements of the transceiver 116 may take the form of a pluggable card or controller for the device 110. For example, the transceiver 116 or selected elements of the transceiver 116 may be implemented on a network interface card (NIC).

The device 112 may include a transceiver 136 for sending and receiving signals, for example, data signals over a channel 109 of the communication network 108. The same or similar structure of the transceiver 116 may be applied to transceiver 136, and thus, the structure of transceiver 136 is not described separately.

Although not explicitly shown, it should be appreciated that devices 110 and 112 and the transceivers 116 and 120 may include other processing devices, storage devices, and/or communication interfaces generally associated with computing tasks, such as sending and receiving data.

Figure 2:
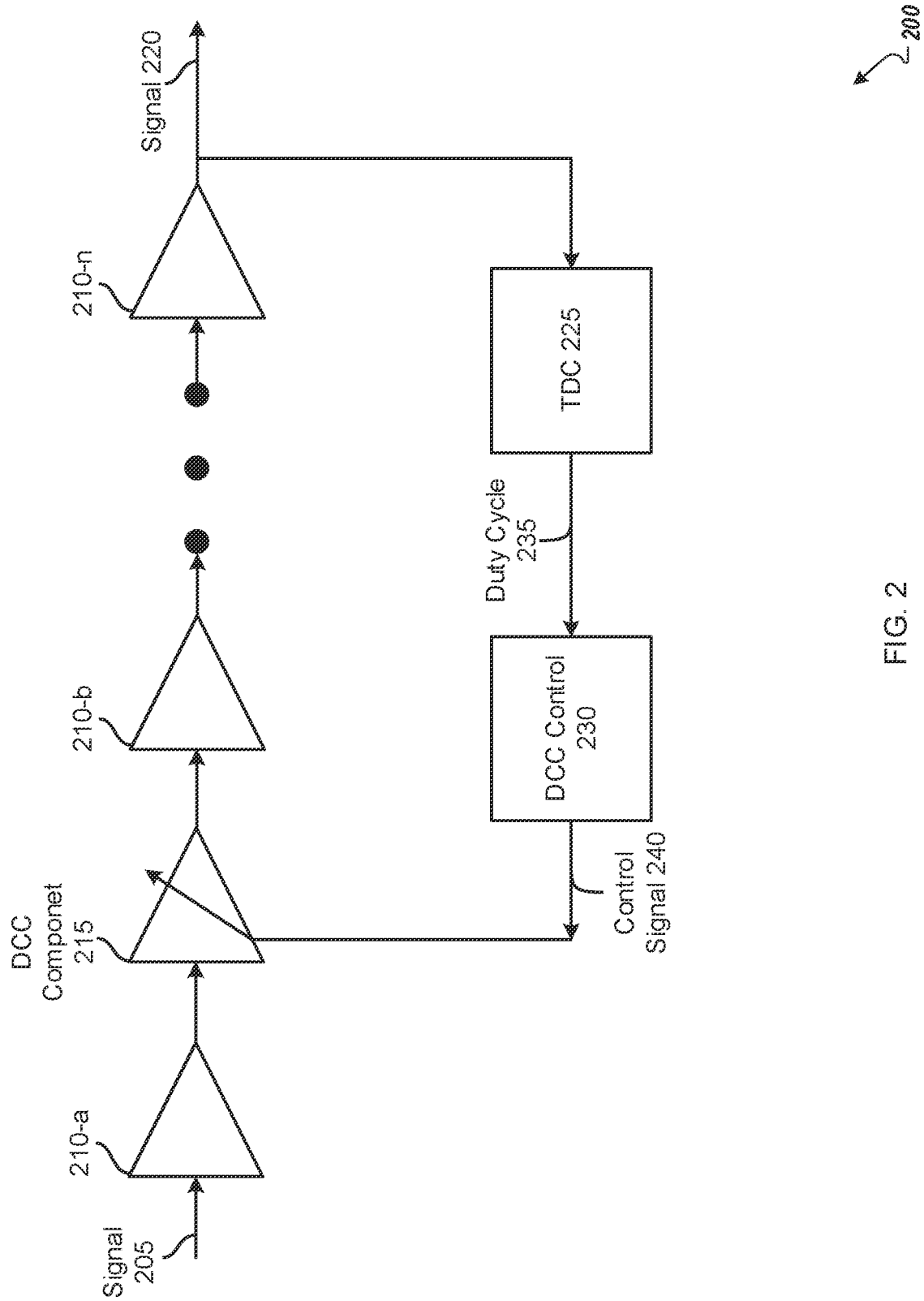
FIG. 2 illustrates an example signal distortion correction system, in accordance with at least some embodiments.

FIG. 2 illustrates an example signal distortion correction system 200 according to at least one example embodiment. The system 200 can be in either device 110 or device 112 as described with reference to FIG. 1. In some embodiments, portions of system 200 can be located in transmitter 102, receiver 104, or processing circuitry 132 as described with reference to FIG. 1. The system 200 can include circuit components 210, a duty cycle correction (DCC) component 215, a time-to-digital converter (TDC) 225, and a DCC control 230. In at least one embodiment, the TDC 225, DCC control 230, and DCC component 215 can collectively be considered DCC 115 as described with reference to FIG. 1. In at least one embodiment, the signal distortion correction system 200 can receive an input signal 205 and transmit an output signal 220.

In at least one embodiment, the signal distortion correction system 200 can be configured to perform signal distortion correction. In at least one embodiment, a system (e.g., system 100 as described with reference to FIG. 1) is configured to suspend or pause a link (e.g., communication network 108 as described with reference to FIG. 1) during a correction of signal distortion—e.g., the system 100 may enter a training mode to perform the signal distortion correction. In at least one embodiment, signal distortion correction system 200 can receive an input signal 205. In some embodiments, signal 205 can be a data signal (e.g., a data stream) transmitted on or received from one or more paths of the link associated with transmitting data. While in the training mode (e.g., during the signal distortion correction), the signal 205 can be a repeating pattern (e.g., '10101010' or '0101010101'"). In some embodiments, signal 205 can be a clock signal transmitted on or received from one or more paths of the link associated with transmitting the clock signal.

In at least one embodiment, the circuit components 210 can be configured to process or drive the signal 205—e.g., the circuit components 210 can be utilized to transmit or receive the signal 205. In some embodiments, the circuit components 210 can be examples of analog circuitry, drivers, inverters, complementary metal-oxide-semiconductor (CMOS) devices, etc. In some embodiments, the signal distortion correction system 200 can include any number of circuit components 210 (e.g., one (1), two (2), three (3), four (4), etc.). The circuit components 210 can be configured to generate an output signal 220 based on processing or driving the signal 205. In some embodiments, the output signal 220 is transmitted over the link. In other embodiments, the output signal 220 is processed at a receiver to determine the logic states of an incoming data stream.

In some embodiments, DCC component 215 can be configured to adjust a duty cycle of signal 205 in response to receiving a control signal 240. In some embodiments, the DCC component 215 can adjust the duty cycle by coupling additional p-channel metal-oxide-semiconductors (PMOS) or n-channel metal-oxide-semiconductors (NMOS) in a CMOS device as described with reference to FIG. 4A. In at least one embodiment, the DCC component 215 can adjust the duty cycle by supplying an additional voltage to clock circuitry as described with reference to FIG. 4B. It should be noted that the position of the DCC component 215 illustrated is one example, and other positions of the DCC component 215 are possible. For example, as illustrated in FIG. 2, the signal distortion correction system 200 samples the output signal 220 at a location different than where the duty cycle is adjusted at DCC component 215. In other embodiments, the signal distortion correction system 200 may sample and adjust the signal 220 at a same location. In at least one embodiment, the location of DCC component 215 can be based on a power consumption of the adjustment of the duty cycle. For example, the DCC component 215 can be located close to signal 205 as less power is consumed adjusting the signal 205 earlier on—e.g., components closer to signal 205 can consume less power than components closer to signal 220. In other examples, the DCC component 215 can be located in areas common to multiple blocks or data paths such that adjusting the duty cycle at the DCC component 215 can adjust the duty cycle for multiple paths and reduce energy consumption.

In at least one embodiment, TDC 225 is configured to determine a first duration of a first portion of signal 220 (e.g., T1) and determine a second duration of a second portion of signal 220 (e.g., T2)—e.g., the TDC 225 is configured to determine the duty cycle 235. That is, the signal 220 can be associated with a duty cycle, and the TDC 225 can be configured to determine an active duration (e.g., determine a duration associated with transmitting a logic state '1' or the first portion of the signal) and determine an inactive duration (e.g., determine a duration associated with transmitting a logic state '0' or the second portion of the signal) during a given clock cycle associated with signal distortion correction system 200. In some embodiments, the TDC 225 can be a self-triggering TDC—e.g., the TDC can operate by receiving a single signal 220. Additional details regarding the TDC 225 are described with reference to FIG. 3.

In some embodiments, DCC control 230 can be configured to receive the duty cycle 235 information from the TDC 225—e.g., receive the duration associated with the first portion of the signal and the duration associated with the second portion of the signal. If the DCC control 230 determines the first duration associated with the first portion satisfies (e.g., is equal to) the second duration associated with the second portion, the DCC control 230 can refrain from transmitting a control signal 240 to the DCC component 215. If the DCC control 230 determines the second duration associated with the second portion of the signal is different than the first duration associated with the first portion of the signal, the DCC control 230 can transmit the control signal 240 indicating to the DCC component 215 to adjust the duty cycle. In at least one embodiment, the DCC control 230 can transmit control signals to the TDC 225 as described with reference to FIG. 3. In some embodiments, the DCC control 230 can be an example of a finite state machine. In other embodiments, the DCC control 230 can be part of firmware of system 100. By implementing the signal distortion correction system 200, the duty cycle of the signal 220 can be adjusted more efficiently and consume less area.

Figure 3:
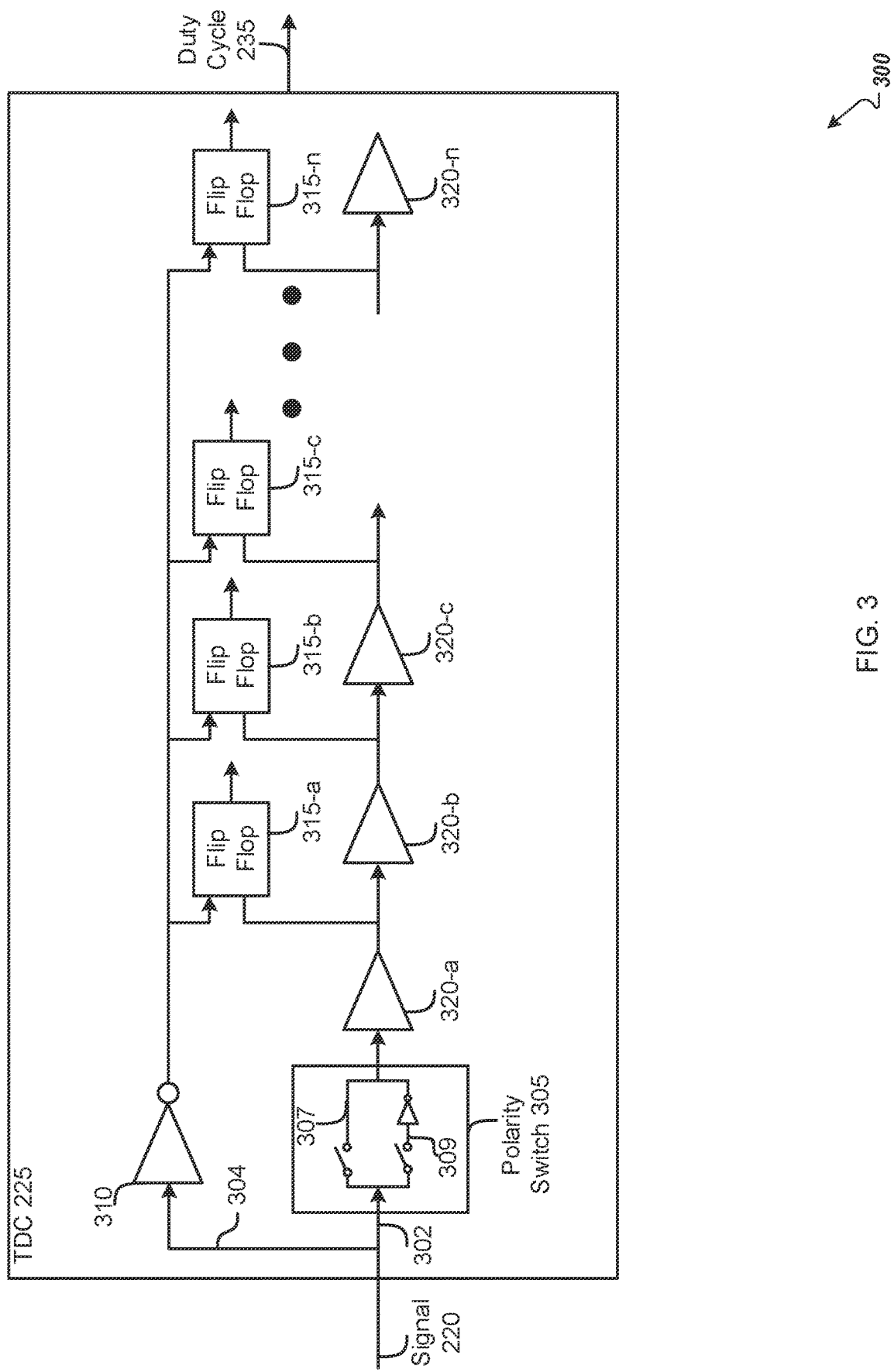
FIG. 3 illustrates examples of a time-to-digital converter, in accordance with at least some embodiments.

FIG. 3 illustrates an example time-to-digital converter (TDC) 225 according to at least one example embodiment. The TDC 225 can be an example of TDC 225 as described with reference to FIG. 2. In at least one embodiment, the TDC 225 can be an example of a self-triggering TDC—e.g., the start and stop inputs (e.g., first path and second path) can both be based on a single signal. For example, TDC 225 can receive the single signal 220 as described with reference to FIG. 2. In at least one embodiment, the TDC 225 can be configured to generate duty cycle 235 information as described with reference to FIG. 2. In at least one embodiment, the TDC 225 can include a polarity switch 305, an inverter 310, one or more flip-flops 315, and one or more delay components 320.

In at least one embodiment, the TDC 225 includes a first path 302 and a second path 304, where both the first path 302 and second path 304 depend from signal 220—e.g., the TDC 225 is a self-triggering TDC 225. In some embodiments, the TDC 225 is configured to determine a duty cycle 235 of the signal 220—e.g., determine a first duration associated with a first portion of the signal 220 and determine a second duration associated with a second portion of the signal 220.

In some embodiments, to determine the first duration associated with the first portion, the TDC 225 is configured to route the signal 220 on the first path 302 and through the path 307 of the polarity switch 305—e.g., route the original signal 220 onto the first path 302. In at least one embodiment, the duty cycle correction (DCC) control 230 is configured to select either the path 307 or the path 309 of the polarity switch 305. After routing the signal 220 through the path 307, the TDC 225 is configured to delay the signal 220 one or more times at one or more delay components 320. In such embodiments, each delay component 320 is configured to delay the incoming signal by a same amount—e.g., each delay component 320 is configured to delay the incoming signal by τ. For example, the first delay component 320-a can delay the signal 220 by τ and generate a first delayed signal. In such examples, the first delay component 320-a can output the first delayed signal to a second delay component 320-b and also to a first flip-flop 315-a. In some examples, the second delay component 320-b can delay the first delayed signal by τ and generate a second delay signal. In such examples, the second delay component 320-b can output the second delayed signal to a third delay component 320-c and a second flip-flop 315-b. In some embodiments, the TDC 225 can continue to delay the signal by τ at respective delay components 320 and store the generated delayed signals at respective flip-flops 315—e.g., delay the second delayed signal at the third delay component 320-c and so forth.

In at least one embodiment, the TDC 225 is configured to invert the signal 220 on the second path 304 at the inverter 310. In such embodiments, the TDC 225 is configured to utilize the inverted signal 220 as a clock signal to sample the delayed signals stored at the one or more flip-flops 315. In at least one embodiment, the TDC 225 can sample the delayed signals from the rising edge to the falling edge. Accordingly, the TDC 225 can sample the delayed signals to determine a duration of the first portion of the signal 220. That is, the signal 220 can be a repeating pattern (e.g., '101010'). In such embodiments, the initial sampling using the inverted signal 220 can result in determining a logic state '1.' As the TDC 225 continues to sample the delayed signals, a certain amount of delay at some point can cause the inverted signal 220 to sample a '0' rather than a '1'—e.g., after the certain amount of delay, the delayed signal transitions from a '1' to a '0' when sampled with the inverted signal 220. For example, the TDC 225 can determine that after six delays (e.g., six τ), the respective delayed signal 220 is at a '0' for a first time rather than a '1' when sampled with the inverted signal 220. Accordingly, the TDC 225 can determine the duration of the first portion of the signal is six τ. In at least one embodiment, the TDC 225 need not determine a precise value for the duration—e.g., the TDC 225 does not determine a delay value having a unit of seconds, rather it is sufficient the TDC 225 determines it took six τ.

After outputting the duration of the first portion of the signal, the DCC control 230 can transmit a control signal to the TDC 225 and cause the polarity switch 305 to select the path 309. In such embodiments, the signal 220 can be inverted to generate a second signal on the first path 302. In some embodiments, the TDC 225 can delay the second signal on the first path 302 as described with reference to delaying the signal 220 on the first path. That is, the TDC 225 can delay the second signal by τ at the first delay component, store the delayed second signal at flip-flop 315-a, then delay the delayed second signal by τ at the second delay component 320-b, store the twice-delayed second signal at flip-flop 315-b, and so forth. In at least one embodiment, the TDC can utilize the inverted signal 220 on the second path 304 to sample the delayed second signals stored at the flip-flops 315-a. In some embodiments, when the TDC 225 utilizes the polarity switch, the signal 220 is inverted, and the repeating pattern becomes '010101.' Accordingly, the second portion of the signal is at the logic state '1' during a given clock cycle. Because the TDC 225 samples from the rising edge to the falling edge with the inverted signal 220 on the path 304, the TDC 225 determines the duration of the second portion of the signal. For example, the initial sampling using the inverted signal 220 can determine a logic state '1' for the second portion. As the TDC 225 continues to sample the delayed second signals, at some point a certain amount of delay can cause the inverted signal 220 to sample a '0' rather than a 1—e.g., after the certain amount of delay, the delayed second signal transitions from a '1' to a '0' when sampled with the inverted signal 220. For example, the TDC 225 can determine that after four delays (e.g., four τ), the respective delayed second signal 220 is at a '0' rather than a '1' when sampled with the inverted signal 220. Accordingly, the TDC 225 can determine the duration of the second portion of the signal is four τ. By determining the duration of the first portion and the second portion, the TDC 225 can output the duty cycle 235 information to the DCC control 230 for comparison. For example, the DCC control 230 can determine the duration of the first portion satisfies or fails to satisfy a target duty cycle—e.g., a target duty cycle of 50%, where the duration of the first portion is equal to the duration of the second portion.

It should be noted FIG. 3 illustrates one possible self-triggered TDC 225. In other embodiments, the TDC 225 can be a different self-triggering TDC 225. For example, the TDC 225 could refrain from inverting the signal 220 on the second path 304 and invert the signal 220 to determine the duration of the first portion and refrain from inverting the signal 220 to determine the duration of the second portion.

Figure 4A:
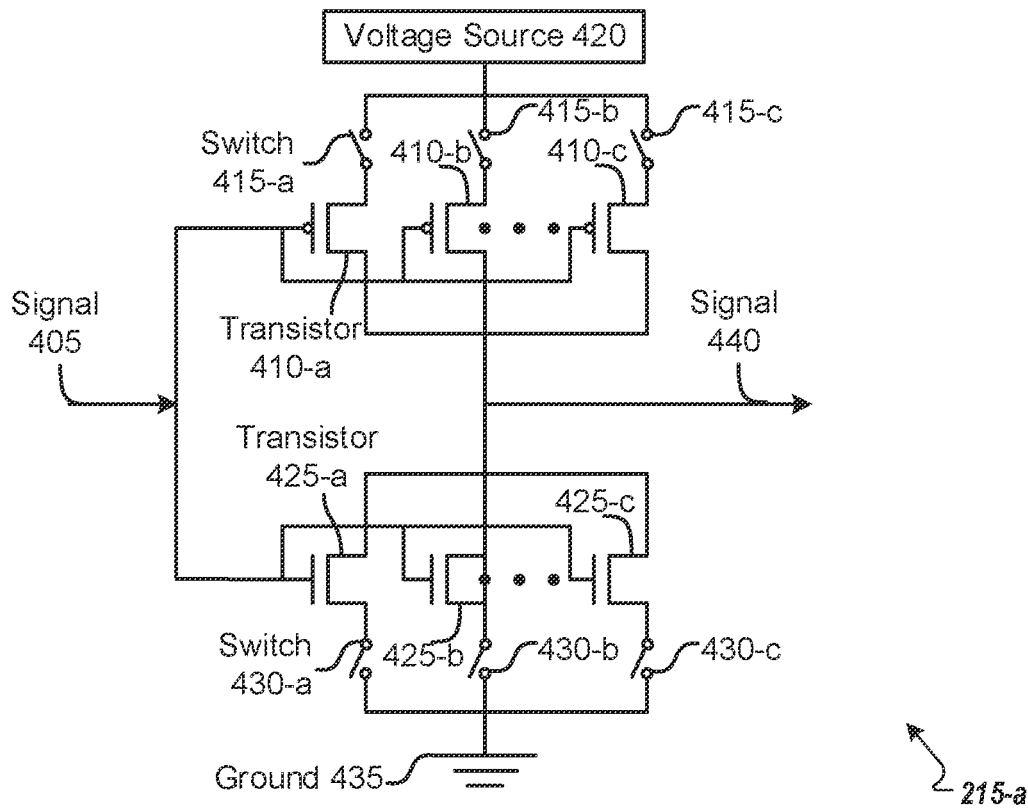
FIGS. 4A and 4B illustrate examples of devices implementing signal distortion correction, in accordance with at least some embodiments.
Figure 4B:
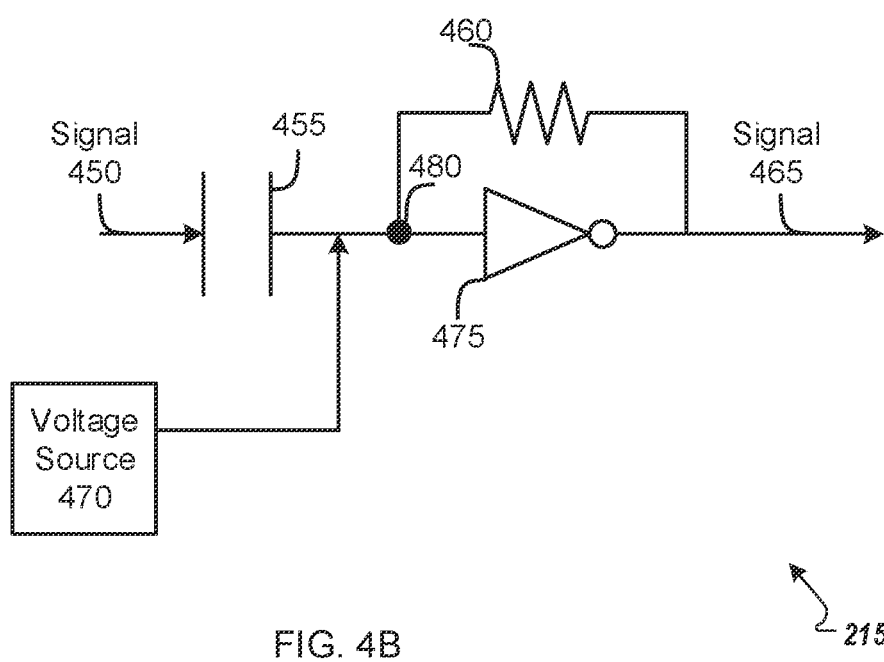

FIGS. 4A and 4B illustrate examples of duty cycle correction (DCC) components 215 as described with reference to FIG. 2. For example, FIG. 4A illustrates a DCC component 215-a. In some embodiments, DCC component 215-a can be utilized when transmitting or receiving data. The DCC component 215-a can be configured to receive a control signal 240 from the DCC control 230 during a calibration of a duty cycle for a signal 205 as described with reference to FIG. 2. In one embodiment, DCC component 215-a can be an example of a complementary metal-oxide-semiconductor (CMOS) device utilized as an inverter or driver. In such embodiments, DCC component 215-a can include a p-channel metal-oxide-semiconductor (PMOS) transistor 410, an n-channel metal-oxide-semiconductor (NMOS) transistor 425, switches 415, switches 430, and a voltage source 420. In some embodiments, the DCC component 215-a can also be coupled to a ground 435.

In at least one embodiment, DCC component 215-a can be configured to receive a signal 405. In at least one embodiment, the signal 405 is an example of a data signal. In some embodiments, the DCC component 215-a can receive the signal 405 from a circuit component 210 as described with reference to FIG. 2. During a manufacturing or initialization process, the DCC 215-a can be configured to couple at least one PMOS transistor 410 to the voltage source 420 (e.g., VDD) via a switch 415 and couple at least one NMOS transistor 425 to ground 435. In such embodiments, the PMOS transistor 410 can affect a rise time of a data symbol, and the NMOS transistor 425 can affect a fall time of a data symbol. Accordingly, the DCC component 315-a can be configured to process and modify the signal 405 to generate an output signal 440. In some embodiments, the DCC component 215-a is configured to output signal 440 to another circuit component 210 as described with reference to FIG. 2.

In some embodiments, the DCC component 215-a can receive a control signal 240 from DCC control 230 as described with reference to FIG. 2. For example, the DCC component 215-a can receive the control signal 240 during a calibration process of the duty cycle when a first duration of a first portion of the signal is different than a second duration of a second portion of the signal—e.g., the observed duty cycle fails to satisfy a target duty cycle (e.g., 50%). In at least one embodiment, when the DCC component 215-a receives the control signal 240, the DCC component 215-a can couple additional PMOS transistors 410 or NMOS transistors 425 with the voltage source 420 or ground 435, respectively. For example, if switch 415-a and switch 430-a are initially on (e.g., active), the DCC component 215-a can activate switch 415-b to couple PMOS transistor 410-b to the voltage source 420 or activate switch 430-b to couple NMOS transistor 425-b to ground 435. In some embodiments, the DCC component 215-a can decrease a rise time of the data symbol by coupling additional PMOS transistors 410 to the voltage source. In other embodiments, the DCC component 215-a can decrease a fall time of the data symbol by coupling additional NMOS transistors 425 to ground.

In some embodiments, whether the DCC component 215-a couples an additional PMOS transistor 410 to the voltage source 420 or additional NMOS transistor 425 to ground 435 can be based on the control signal 240 received from the DCC control 230. For example, the DCC control 230 can indicate to couple an additional PMOS transistor 410 with the voltage source 420 if the first duration of the first portion of the signal is larger than the second duration of the second portion of the signal. In other examples, the DCC control 230 can indicate to couple an additional NMOS transistor 425 with ground 435 if the first duration of the first portion of the signal is smaller than the second duration of the second portion of the signal. Following the adjustment of signal 440, the signal distortion correction system 200 can determine a new duty cycle of the adjusted signal 440 at the TDC 225. If the DCC control 230 determines the new duty cycle fails to satisfy the target duty cycle, the DCC control 230 can transmit another control signal 240 to the DCC 215-a. In such embodiments, the DCC 215-a can couple an additional PMOS transistor 410 to the voltage source 420 or an additional NMOS transistor 425 to ground 435. The signal distortion correction system 200 can repeat this process until the target duty cycle is satisfied. Once satisfied, the signal distortion correction system 200 can terminate the duty cycle correction process and resume data operations on the link as described with reference to FIG. 2.

FIG. 4B illustrates a DCC component 215-b. In some embodiments, DCC component 215-b can be utilized when transmitting or receiving a clock signal. The DCC component 215-b can be configured to receive a control signal 240 from the DCC control 230 during a calibration of a duty cycle for a signal 205 as described with reference to FIG. 2. In one embodiment, DCC component 215-b can be an example of clock circuitry utilized to process or drive the clock signal. In such embodiments, DCC component 215-b can include a capacitor 455, a resistor 460, an inverter 475, and a voltage source 470.

In at least one embodiment, the DCC component 215-b is configured to receive a signal 450. In at least one embodiment, the signal 450 is an example of a clock signal. In some embodiments, the DCC component 215-b can receive signal 450 from a circuit component 210 as described with reference to FIG. 2. The DCC component 215-b can be configured to generate a constant repeating clock pattern (e.g., signal 465) via the charging and discharging of the capacitor 455 and sending the signal through the resistor 460 and inverter 475.

In some embodiments, the DCC component 215-b can receive a control signal 240 from DCC control 230 as described with reference to FIG. 2. For example, the DCC component 215-b can receive the control signal 240 during a calibration process of the duty cycle when a first duration of a first portion of the signal is different than a second duration of a second portion of the signal—e.g., the observed duty cycle fails to satisfy a target duty cycle (e.g., 50%). In at least one embodiment, when the DCC component 215-b receives the control signal 240, the DCC component 215-b can supply an additional voltage from the voltage source 470 to the node 480. In such embodiments, the DCC component 215-a can alter the slicing of the clock signal and accordingly alter the duty cycle for the generated signal 465—e.g., generate a new duty cycle. The signal distortion correction system 200 can determine whether the altered duty cycle satisfies the target duty cycle. If the signal distortion correction system 200 determines the altered duty cycle does not satisfy the target duty cycle, the DCC control 230 can continue to transmit control signals 240 to alter the voltage supplied by the voltage source 470 until the generated duty cycle satisfies the target duty cycle.

It should be noted that DCC component 215-a and DCC component 215-b are two possible examples of DCC components, and other examples are possible. That is, the duty cycle can be altered by circuits other than DCC component 215-a and DCC component 215-b.

Figure 5:
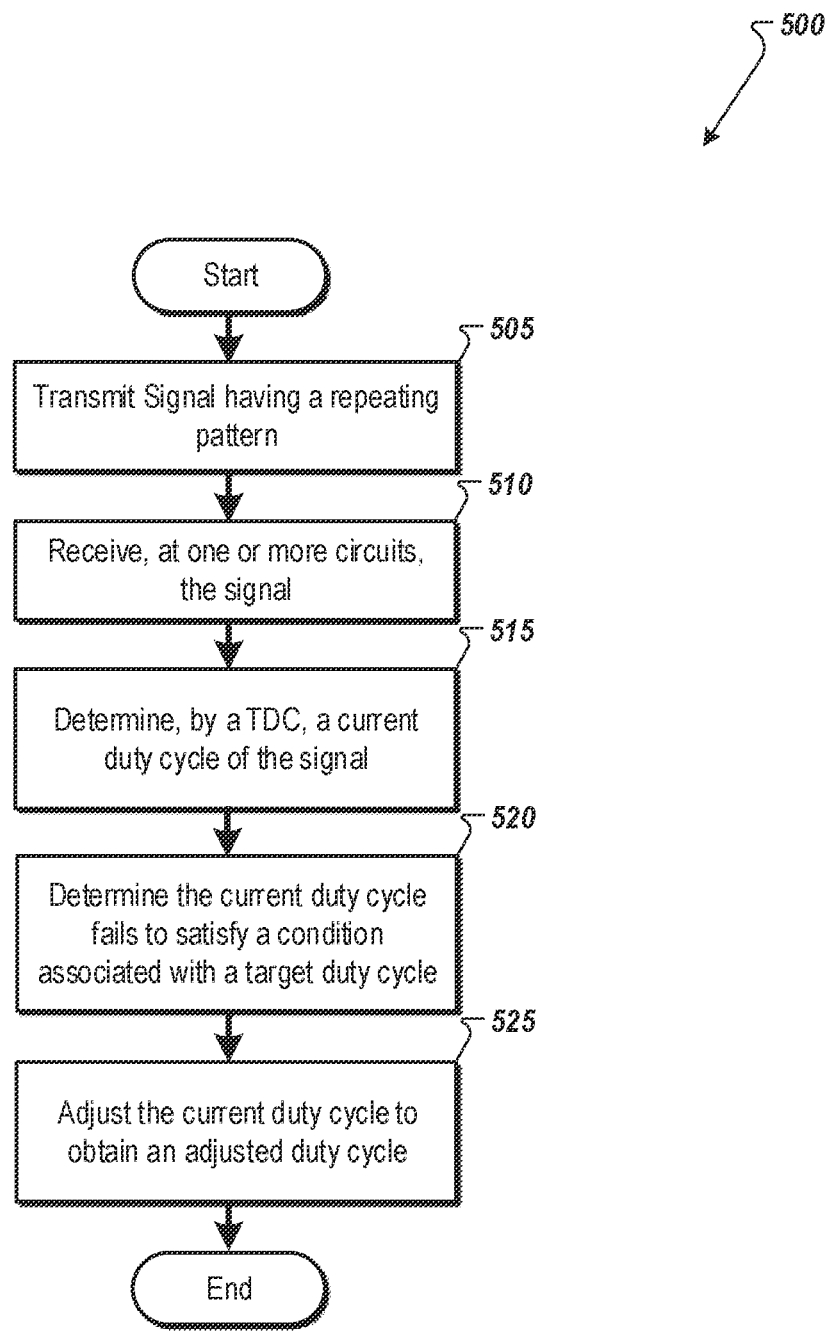
FIG. 5 is a flow diagram of a method for signal distortion correction with a time-to-digital converter (TDC), in accordance with at least some embodiments

FIG. 5 illustrates a flow diagram of a method 500 for signal distortion correction with a time-to-digital converter (TDC). The method 500 can be performed by processing logic comprising hardware, software, firmware, or any combination thereof. In at least one embodiment, the method 500 is performed by signal distortion correction system 200, TDC 225, DCC control 230, and DCC component 215 as described with reference to FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other diagrams illustrating a method for signal distortion correction with a TDC are possible.

At operation 505, a first device (e.g., device 110 as described with reference to FIG. 1) can be configured to transmit a signal having a repeating pattern on either one or more paths associated with transmitting data or on one or more paths associated with transmitting a clock signal. In some embodiments, the first device can perform an error distortion correction on the signal received form the link and perform the operations 505-525 as described herein. In at least one embodiment, the one or more paths associated with transmitting data and the one or more paths associated with transmitting the clock signal are in a link coupled with the first device and a second device (e.g., device 110 as described with reference to FIG. 1). In at least one embodiment, the first device and the second device may be the same device. That is, as described with reference to FIG. 2, the signal distortion correction system 200 can be in either a transmitter 102 or a receiver 104. Accordingly, either the device 110 or the device 112 can perform a duty cycle calibration internally. In at least one embodiment, the first device is configured to suspend the link and refrain from transmitting additional data across the one or more paths associated with transmitting data when transmitting the signal across the one or more paths associated with transmitting data. That is, to perform the duty cycle calibration, either the first device or the second device can enter a training mode and suspend the link with regards to data operation. By entering the training mode, the first device can transmit the repeating pattern across the link in lieu of random data. In some embodiments, the first device is configured to transmit additional data across the one or more paths associated with transmitting the data concurrent with transmitting the repeating pattern across the one or more paths associated with transmitting the clock signals. In other embodiments, the first device is configured to suspend the link and refrain from transmitting additional data across the one or more paths associated with transmitting the data concurrent with transmitting the repeating pattern across the one or more paths associated with transmitting the clock signals. That is, the duty cycle calibration for the clock signal can be performed during training or during data operations associated with the first device and second device.

At operation 510, the second device is configured to receive, at one or more circuits, the signal via either the one or more paths associated with transmitting the data or the one or more paths associated with transmitting the clock signal. In at least one embodiment, the one or more circuits are examples of analog circuitry, drivers, inverters, complementary metal-oxide-semiconductor (CMOS) devices, clock circuitry, etc.

At operation 515, the second device is configured to determine, by a time-to-digital converter (TDC), a current duty cycle of the signal. In some embodiments, the current duty cycle includes a first duration associated with a first portion of the signal and a second duration associated with a second portion of the signal—e.g., the current duty cycle can include a time T1 the signal is at a '1' and a time T2 the signal is at a '0' during each clock cycle. In some embodiments, the TDC is configured to determine the first duration of the first portion and the second duration of the second portion as described with reference to FIG. 3 and FIG. 6. In some embodiments, the second device is configured to transmit, from the TDC to a controller (e.g., DCC control 230), the first duration associated with the first portion of the signal and the second duration associated with the second portion of the signal.

At operation 520, the second device is configured to determine that the current duty cycle fails to satisfy a condition associated with a target duty cycle in response to determining the current duty cycle of the signal. In at least one embodiment, the target duty cycle can be 50%, where the first duration of the first portion of the signal is the same as the second duration of the second portion of the signal. In some embodiments, the controller can determine that the first duration is different than the second duration, where determining that the current duty cycle fails to satisfy the target duty cycle is responsive to the controller determining the first duration is different than the second duration. In at least one embodiment, the controller can transmit a signal to a circuit of the one or more circuits in response to determining that the first duration is different than the second duration. In at least one embodiment, the controller can determine that the first duration is the same as the second duration—e.g., that the current duty cycle satisfies the target duty cycle. In such embodiments, the second device can complete the duty cycle calibration and exit the training mode—e.g., resume normal data operations by transmitting random data over the link.

At operation 525, the second device is configured to adjust the current duty cycle to obtain an adjusted duty cycle in response to the current duty cycle failing to satisfy the condition. In at least one embodiment, to obtain the adjusted duty cycle, the second device is configured to couple an additional p-channel metal-oxide-semiconductor (PMOS) or an additional n-channel metal-oxide-semiconductor (NMOS) to an output of the CMOS responsive to transmitting the control signal to the circuit of the one or more circuits as described with reference to FIG. 4A. In some embodiments, to obtain the adjusted duty cycle, the second device is configured to supply an additional voltage to a node of clock circuitry as described with reference to FIG. 4B. In at least one embodiment, the second device is configured to drive a second signal associated with the adjusted duty cycle through the one or more circuits in response to adjusting the current duty cycle. In some embodiments, the second device is configured to determine the adjusted duty cycle of the second signal—e.g., determine a first duration associated with a first portion of the second signal and determine a second duration associated with a second portion of the second signal. In some embodiments, the second device is configured to correct a distortion of the signal received by adjusting the duty cycle of the signal received until the controller determines a first duration associated with a first portion of a respective signal is equal to a second duration associated with a second portion of the respective signal—e.g., adjust the current duty cycle until the adjusted duty cycle satisfies the target duty cycle.

Figure 6:
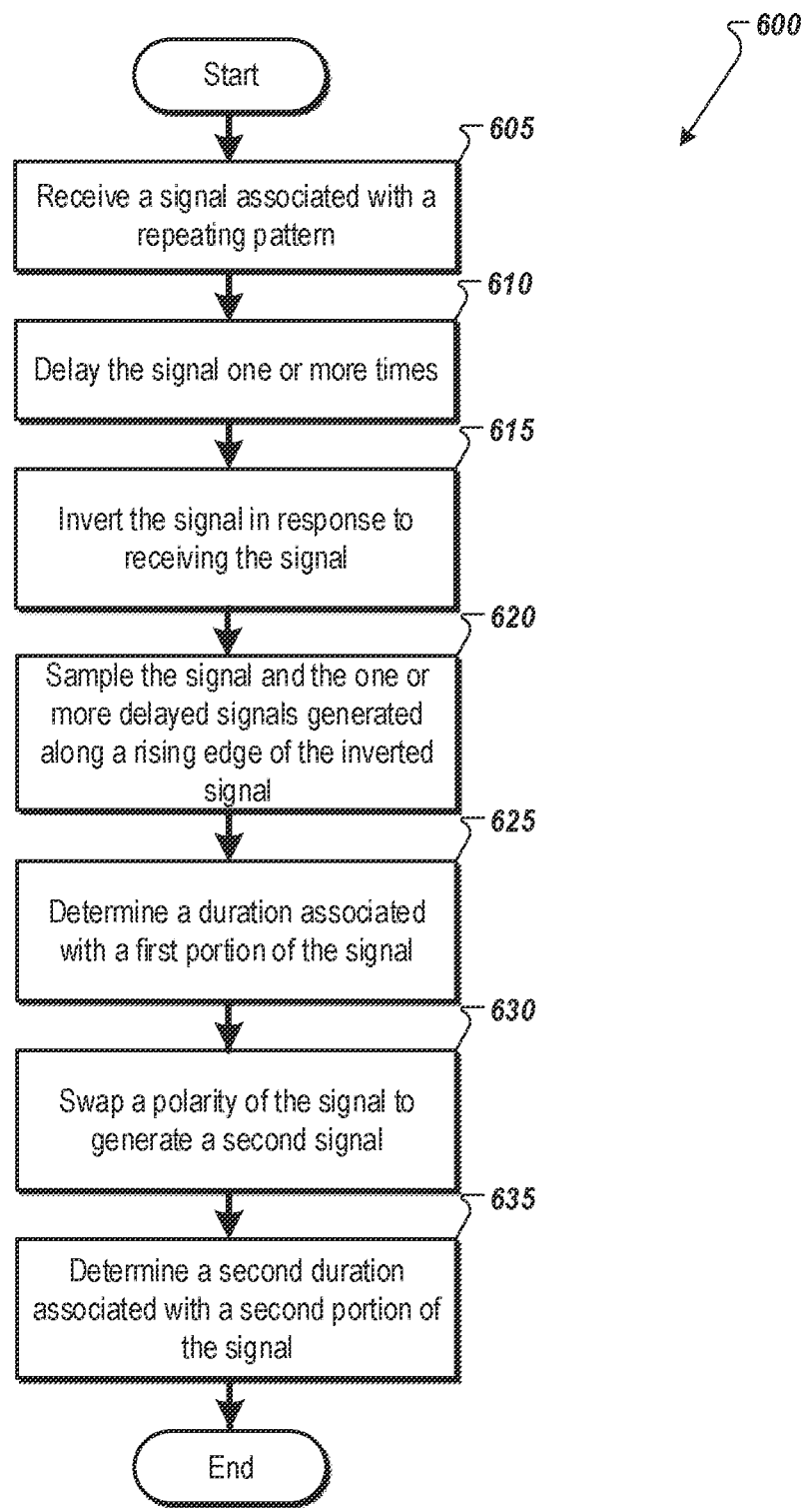
FIG. 6 is a flow diagram of a method for signal distortion correction with a self-triggering time-to-digital converter (TDC), in accordance with at least some embodiments.

FIG. 6 illustrates a flow diagram of a method 600 for signal distortion correction with a self-triggering time-to-digital converter (TDC). The method 600 can be performed by processing logic comprising hardware, software, firmware, or any combination thereof. In at least one embodiment, the method 600 is performed by signal distortion correction system 200, TDC 225, DCC control 230, and DCC component 215 as described with reference to FIG. 2. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other diagrams illustrating a method for signal distortion correction with a self-triggering TDC are possible.

At operation 605, a time-to-digital converter (TDC) is configured to receive a signal associated with a repeating pattern. As described with reference to FIG. 3, the TDC can be an example of a self-triggering TDC. Accordingly, the TDC can utilize the signal associated with the repeating pattern as both a first input (e.g., start input) and a second input (e.g., stop input).

At operation 610, the TDC is configured to delay the signal one or more times at one or more respective delay components in response to receiving the signal. For example, the TDC is configured to delay the signal by a first amount at a first delay component to generate a first delayed signal. In such examples, the TDC can delay the first delayed signal by the first amount at a second delay component to generate a second delayed signal and so forth. In some embodiments, each delay component is configured to delay a respective signal by a same amount.

At operation 615, the TDC is configured to invert the signal associated with the repeating pattern in response to receiving the signal. For example, the TDC can include a first path and a second path as described with reference to FIG. 3. While delaying the signal along the first path, the TDC is configured to invert the signal along the second path and utilize the inverted signal as a clock to sample delayed signals stored at respective flip-flops.

At operation 620, the TDC is configured to sample the signal and each of the one or more delayed signals generated at the one or more delayed components along a rising edge of the inverted signal by storing a logic state determined from each sample at a respective flip-flop.

At operation 625, the TDC is configured to determine a duration associated with a first portion of the signal in response to sampling the signal and each of the one or more delay signals. In some embodiments, the TDC is configured to determine the duration associated with the first portion of the signal based on determining a transition of the logic state stored at each respective flip-flop as described with reference to FIG. 3.

At operation 630, the TDC is configured to swap a polarity of the signal to generate a second signal responsive to determining the first duration associated with the first portion of the signal. In at least one embodiment, the TDC is configured to swap the polarity in response to receiving a control signal from a controller coupled to the TDC—e.g., in response to receiving a control signal from DCC 230. In at least one embodiment, the TDC is configured to deactivate a first switch coupling the signal to the one or more delay components responsive to receiving the control signal. In some embodiments, the TDC is configured to activate a second switch coupling the signal to an inverter and the one or more delay components responsive to receiving the control signal, where the TDC is configured to generate the second signal responsive to activating the second switch. That is, the TDC can go from selecting the path 307 to selecting the path 309 in response to receiving the control signal as described with reference to FIG. 3.

At operation 635, the TDC is configured to determine a second duration associated with a second portion of the signal. For example, the TDC is configured to delay the second signal one or more times at the one or more respective delay components in response to generating the second signal. In some embodiments, the TDC is configured to sample the second signal and each of the one or more delayed second signals generated at the one or more delay components along a rising edge of the inverted signal by storing a logic state determined from each sample at the respective flip-flop. In at least one embodiment, the TDC is configured to determine the second duration of the second portion of the signal in response to sampling the second signal and each of the one or more delayed second signals. That is, the TDC is configured to determine the second duration associated with the second portion of the signal based on determining a transition of the logic state stored at each respective flip-flop as described with reference to FIG. 3. Accordingly, the TDC is configured to determine a current duty cycle of the signal, the current duty cycle having the first duration and the second duration. In at least one embodiment, the TDC is configured to output the current duty cycle of the signal to a controller (e.g., DCC control 230).

Figure 7:
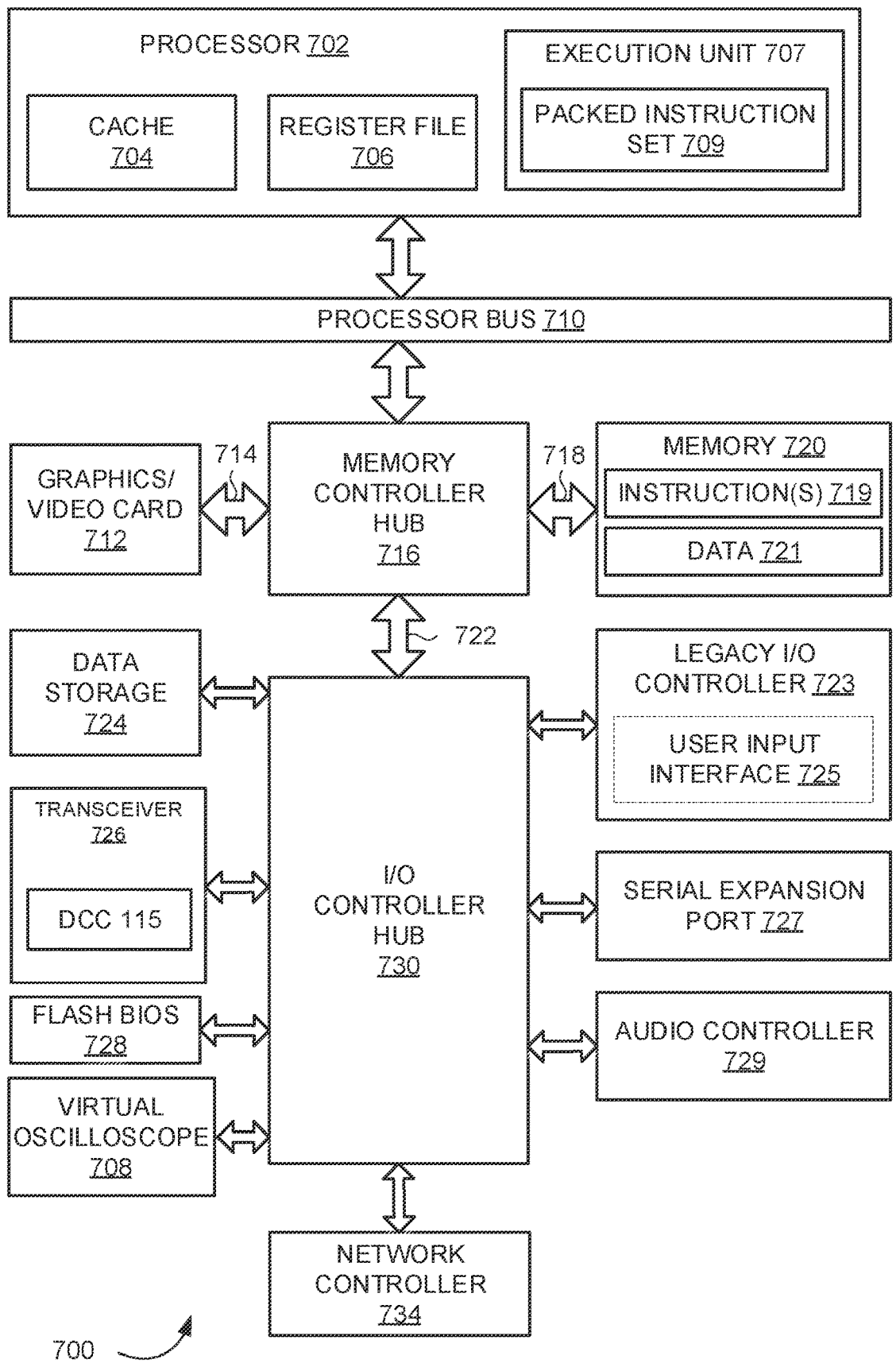
FIG. 7 illustrates an example computer system including a transceiver including a chip-to-chip interconnect, in accordance with at least some embodiments.

FIG. 7 illustrates a computer system 700 in accordance with at least one embodiment. In at least one embodiment, computer system 700 may be a system with interconnected devices and components, an SOC, or some combination. In at least one embodiment, computer system 700 is formed with a processor 702 that may include execution units to execute an instruction. In at least one embodiment, computer system 700 may include, without limitation, a component, such as processor 702, to employ execution units including logic to perform algorithms for processing data. In at least one embodiment, computer system 700 may include processors, such as PENTIUM® Processor family, Xeon™, Itanium®, XScale™ and/or StrongARM™, Intel® Core™, or Intel® Nervana™ microprocessors available from Intel Corporation of Santa Clara, California, although other systems (including PCs having other microprocessors, engineering workstations, set-top boxes and like) may also be used. In at least one embodiment, computer system 700 may execute a version of WINDOWS' operating system available from Microsoft Corporation of Redmond, Wash., although other operating systems (UNIX and Linux for example), embedded software, and/or graphical user interfaces, may also be used.

In at least one embodiment, computer system 700 may be used in other devices such as handheld devices and embedded applications. Some examples of handheld devices include cellular phones, Internet Protocol devices, digital cameras, personal digital assistants ("PDAs"), and handheld PCs. In at least one embodiment, embedded applications may include a microcontroller, a digital signal processor (DSP), an SoC, network computers ("NetPCs"), set-top boxes, network hubs, wide area network ("WAN") switches, or any other system that may perform one or more instructions. In an embodiment, computer system 700 may be used in devices such as graphics processing units (GPUs), network adapters, central processing units and network devices such as switch (e.g., a high-speed direct GPU-to-GPU interconnect such as the NVIDIA GH100 NVLINK or the NVIDIA Quantum 2 64 Ports InfiniBand NDR Switch).

In at least one embodiment, computer system 700 may include, without limitation, processor 702 that may include, without limitation, one or more execution units 707 that may be configured to execute a Compute Unified Device Architecture ("CUDA") (CUDA® is developed by NVIDIA Corporation of Santa Clara, CA) program. In at least one embodiment, a CUDA program is at least a portion of a software application written in a CUDA programming language. In at least one embodiment, computer system 700 is a single processor desktop or server system. In at least one embodiment, computer system 700 may be a multiprocessor system. In at least one embodiment, processor 702 may include, without limitation, a CISC microprocessor, a RISC microprocessor, a VLIW microprocessor, a processor implementing a combination of instruction sets, or any other processor device, such as a digital signal processor, for example. In at least one embodiment, processor 702 may be coupled to a processor bus 710 that may transmit data signals between processor 702 and other components in computer system 700.

In at least one embodiment, processor 702 may include, without limitation, a Level 1 ("L1") internal cache memory ("cache") 704. In at least one embodiment, processor 702 may have a single internal cache or multiple levels of internal cache. In at least one embodiment, cache memory may reside external to processor 702. In at least one embodiment, processor 702 may also include a combination of both internal and external caches. In at least one embodiment, a register file 706 may store different types of data in various registers including, without limitation, integer registers, floating point registers, status registers, and instruction pointer register.

In at least one embodiment, execution unit 707, including, without limitation, logic to perform integer and floating point operations, also resides in processor 702. Processor 702 may also include a microcode ("ucode") read only memory ("ROM") that stores microcode for certain macro instructions. In at least one embodiment, an execution unit of processor 702 may include logic to handle a packed instruction set 709. In at least one embodiment, by including packed instruction set 709 in an instruction set of a general-purpose processor 702, along with associated circuitry to execute instructions, operations used by many multimedia applications may be performed using packed data in a general-purpose processor 702. In at least one embodiment, many multimedia applications may be accelerated and executed more efficiently by using full width of a processor's data bus for performing operations on packed data, which may eliminate a need to transfer smaller units of data across a processor's data bus to perform one or more operations one data element at a time.

In at least one embodiment, an execution unit may also be used in microcontrollers, embedded processors, graphics devices, DSPs, and other types of logic circuits. In at least one embodiment, computer system 700 may include, without limitation, a memory 720. In at least one embodiment, memory 720 may be implemented as a DRAM device, an SRAM device, flash memory device, or other memory device. Memory 720 may store instruction(s) 719 and/or data 721 represented by data signals that may be executed by processor 702.

In at least one embodiment, a system logic chip may be coupled to processor bus 710 and memory 720. In at least one embodiment, the system logic chip may include, without limitation, a memory controller hub ("MCH") 716, and processor 702 may communicate with MCH 716 via processor bus 710. In at least one embodiment, MCH 716 may provide a high bandwidth memory path 718 to memory 720 for instruction and data storage and for storage of graphics commands, data and textures. In at least one embodiment, MCH 716 may direct data signals between processor 702, memory 720, and other components in computer system 700 and to bridge data signals between processor bus 710, memory 720, and a system I/O 722. In at least one embodiment, system logic chip may provide a graphics port for coupling to a graphics controller. In at least one embodiment, MCH 716 may be coupled to memory 720 through high bandwidth memory path 718, and graphics/video card 712 may be coupled to MCH 716 through an Accelerated Graphics Port ("AGP") interconnect 714.

In at least one embodiment, computer system 700 may use system I/O 722 that is a proprietary hub interface bus to couple MCH 716 to I/O controller hub ("ICH") 730. In at least one embodiment, ICH 730 may provide direct connections to some I/O devices via a local I/O bus. In at least one embodiment, a local I/O bus may include, without limitation, a high-speed I/O bus for connecting peripherals to memory 720, a chipset, and processor 702. Examples may include, without limitation, an audio controller 729, a firmware hub ("flash BIOS") 728, a transceiver 726, a data storage 724, a legacy I/O controller 723 containing a user input interface 725 and a keyboard interface, a serial expansion port 727, such as a USB, and a network controller 734. Data storage 724 may comprise a hard disk drive, a floppy disk drive, a CD-ROM device, a flash memory device, or other mass storage device.

In at least one embodiment, FIG. 7 illustrates a system, which includes interconnected hardware devices or "chips" in a transceiver 726—e.g., the transceiver 726 includes a chip-to-chip interconnect including the first device 110 and second device 112 as described with reference to FIG. 1). In at least one embodiment, FIG. 7 may illustrate an exemplary SoC. In at least one embodiment, devices illustrated in FIG. 7 may be interconnected with proprietary interconnects, standardized interconnects (e.g., PCIe), or some combination thereof and utilize a GRS link. In at least one embodiment, one or more components of system 700 are interconnected using compute express link ("CXL") interconnects. In an embodiment, the transceiver 726 can include a duty cycle correction (DCC) 115 as described with reference to FIG. 1. In such embodiments, the DCC 115 can be configured to calibrate a duty cycle of a signal transmitted or received by the transceiver 726. In at least one embodiment, the DCC 115 can include a self-triggering TDC (e.g., TDC 225 as described with reference to FIG. 2) to determine the duty cycle and a DCC control (e.g., DCC control 240 as described with reference to FIG. 2) to initiate a duty cycle correction.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit the disclosure to a specific form or forms disclosed, but on the contrary, the intention is to cover all modifications, alternative constructions, and equivalents falling within the spirit and scope of the disclosure, as defined in appended claims.

Use of terms "a" and "an" and "the" and similar referents in the context of describing disclosed embodiments (especially in the context of following claims) are to be construed to cover both singular and plural, unless otherwise indicated herein or clearly contradicted by context, and not as a definition of a term. Terms "comprising," "having," "including," and "containing" are to be construed as open-ended terms (meaning "including, but not limited to,") unless otherwise noted. "Connected," when unmodified and referring to physical connections, is to be construed as partly or wholly contained within, attached to, or joined together, even if there is something intervening. Recitations of ranges of values herein are merely intended to serve as a shorthand method of referring individually to each separate value falling within the range, unless otherwise indicated herein, and each separate value is incorporated into the specification as if it were individually recited herein. In at least one embodiment, the use of the term "set" (e.g., "a set of items") or "subset" unless otherwise noted or contradicted by context, is to be construed as a nonempty collection comprising one or more members. Further, unless otherwise noted or contradicted by context, the term "subset" of a corresponding set does not necessarily denote a proper subset of the corresponding set, but subset and corresponding set may be equal.

Conjunctive language, such as phrases of the form "at least one of A, B, and C," or "at least one of A, B and C," unless specifically stated otherwise or otherwise clearly contradicted by context, is otherwise understood with the context as used in general to present that an item, term, etc., may be either A or B or C, or any nonempty subset of the set of A and B and C. For instance, in an illustrative example of a set having three members, conjunctive phrases "at least one of A, B, and C" and "at least one of A, B and C" refer to any of the following sets: {A}, {B}, {C}, {A, B}, {A, C}, {B, C}, {A, B, C}. Thus, such conjunctive language is not generally intended to imply that certain embodiments require at least one of A, at least one of B and at least one of C each to be present. In addition, unless otherwise noted or contradicted by context, the term "plurality" indicates a state of being plural (e.g., "a plurality of items" indicates multiple items). In at least one embodiment, the number of items in a plurality is at least two, but can be more when so indicated either explicitly or by context. Further, unless stated otherwise or otherwise clear from context, the phrase "based on" means "based at least in part on" and not "based solely on."

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (e.g., executable instructions, one or more computer programs or one or more applications) executing collectively on one or more processors, by hardware or combinations thereof. In at least one embodiment, code is stored on a computer-readable storage medium, for example, in the form of a computer program comprising a plurality of instructions executable by one or more processors. In at least one embodiment, a computer-readable storage medium is a non-transitory computer-readable storage medium that excludes transitory signals (e.g., a propagating transient electric or electromagnetic transmission) but includes non-transitory data storage circuitry (e.g., buffers, cache, and queues) within transceivers of transitory signals. In at least one embodiment, code (e.g., executable code or source code) is stored on a set of one or more non-transitory computer-readable storage media having stored thereon executable instructions (or other memory to store executable instructions) that, when executed (i.e., as a result of being executed) by one or more processors of a computer system, cause a computer system to perform operations described herein. In at least one embodiment, a set of non-transitory computer-readable storage media comprises multiple non-transitory computer-readable storage media and one or more of individual non-transitory storage media of multiple non-transitory computer-readable storage media lack all of the code while multiple non-transitory computer-readable storage media collectively store all of the code. In at least one embodiment, executable instructions are executed such that different instructions are executed by different processors.

Accordingly, in at least one embodiment, computer systems are configured to implement one or more services that singly or collectively perform operations of processes described herein and such computer systems are configured with applicable hardware and/or software that enable the performance of operations. Further, a computer system that implements at least one embodiment of present disclosure is a single device and, in another embodiment, is a distributed computer system comprising multiple devices that operate differently such that distributed computer system performs operations described herein and such that a single device does not perform all operations.

Use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

All references, including publications, patent applications, and patents, cited herein are hereby incorporated by reference to the same extent as if each reference were individually and specifically indicated to be incorporated by reference and were set forth in its entirety herein.

In description and claims, terms "coupled" and "connected," along with their derivatives, may be used. It should be understood that these terms may not be intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification terms such as "processing," "computing," "calculating," "determining," or like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, the term "processor" may refer to any device or portion of a device that processes electronic data from registers and/or memory and transform that electronic data into other electronic data that may be stored in registers and/or memory. A "computing platform" may comprise one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. In at least one embodiment, terms "system" and "method" are used herein interchangeably insofar as the system may embody one or more methods and methods may be considered a system.

In the present document, references may be made to obtaining, acquiring, receiving, or inputting analog or digital data into a subsystem, computer system, or computer-implemented machine. In at least one embodiment, the process of obtaining, acquiring, receiving, or inputting analog and digital data can be accomplished in a variety of ways such as by receiving data as a parameter of a function call or a call to an application programming interface. In at least one embodiment, processes of obtaining, acquiring, receiving, or inputting analog or digital data can be accomplished by transferring data via a serial or parallel interface. In at least one embodiment, processes of obtaining, acquiring, receiving, or inputting analog or digital data can be accomplished by transferring data via a computer network from providing entity to acquiring entity. In at least one embodiment, references may also be made to providing, outputting, transmitting, sending, or presenting analog or digital data. In various examples, processes of providing, outputting, transmitting, sending, or presenting analog or digital data can be accomplished by transferring data as an input or output parameter of a function call, a parameter of an application programming interface or inter-process communication mechanism.

Although descriptions herein set forth example embodiments of described techniques, other architectures may be used to implement described functionality, and are intended to be within the scope of this disclosure. Furthermore, although specific distributions of responsibilities may be defined above for purposes of description, various functions and responsibilities might be distributed and divided in different ways, depending on circumstances.

Furthermore, although the subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A system comprising:
 a link comprising one or more paths associated with transmitting data and one or more paths associated with transmitting a clock signal;
 a first device coupled with the link, the first device to:
  transmit a signal having a repeating pattern on either the one or more paths associated with transmitting the data or the one or more paths associated with transmitting the clock signal;
 a second device coupled with the link and comprising one or more circuits and a time-to-digital converter (TDC) comprising one or more delay components, the second device to:
  receive at the one or more circuits the signal via either the one or more paths associated with transmitting data or the one or more paths associated with transmitting the clock signal;
  delay the signal one or more times at the one or more delay components of the TDC;
  determine, by sampling the signal and one or more delayed signals at the TDC, a current duty cycle of the signal, the current duty cycle having a first duration associated with a first portion of the signal and a second duration associated with a second portion of the signal;
  determine that the current duty cycle fails to satisfy a condition associated with a target duty cycle in response to determining the current duty cycle of the signal; and
  adjust the current duty cycle to obtain an adjusted duty cycle in response to the current duty cycle failing to satisfy the condition.

2. The system of claim 1, wherein the second device further comprises a controller, the second device is further to:

transmit, from the TDC to the controller, the first duration associated with the first portion of the signal and the second duration associated with the second portion of the signal;
determine, at the controller, that the first duration is different than the second duration, wherein the second device is to determine the current duty cycle fails to satisfy the condition responsive to determining the first duration is different than the second duration; and
transmit a control signal to a circuit of the one or more circuits in response to determining the first duration is different than the second duration.

3. The system of claim 2, wherein the circuit comprises a complementary metal-oxide-semiconductor (CMOS), and wherein to adjust the current duty cycle to obtain the adjusted duty cycle, the second device is further to:
couple an additional p-channel metal-oxide-semiconductor (PMOS) or an additional n-channel metal-oxide-semiconductor (NMOS) to an output of the CMOS responsive to transmitting the control signal to the circuit of the one or more circuits.

4. The system of claim 1, wherein the second device is further to:
drive a second signal associated with the adjusted duty cycle through the one or more circuits responsive to adjusting the current duty cycle; and
determine, at the TDC, the adjusted duty cycle of the second signal, the adjusted duty cycle having a first duration associated with a first portion of the second signal and a second duration associated with a second portion of the second signal.

5. The system of claim 4, wherein the second device further comprises a controller, the second device is further to:
correct a distortion of the signal received by adjusting the current duty cycle of the signal received until the controller determines a first duration associated with a first portion of a respective signal is equal to a second duration associated with a second portion of the respective signal.

6. The system of claim 1, wherein to transmit the signal associated with the repeating pattern across the one or more paths associated with transmitting data, the first device is to:
suspend the link; and
refrain from transmitting additional data across the one or more paths associated with transmitting data while transmitting the signal.

7. The system of claim 1, wherein to transmit the signal associated with the repeating pattern across the one or more paths associated with transmitting the clock signal, the first device is further to:
transmit additional data across the one or more paths associated with transmitting data concurrent with transmitting the repeating pattern across the one or more paths associated with transmitting the clock signal.

8. The system of claim 1, wherein to transmit the signal associated with the repeating pattern across the one or more paths associated with transmitting the clock signal, the first device is further to:
suspend the link; and
refrain from transmitting additional data across the one or more paths associated with transmitting data while transmitting the signal.

9. A device, comprising:
a time-digital-converter (TDC) to:
receive a signal associated with a repeating pattern;
delay the signal one or more times at one or more delay components in response to receiving the signal;
invert the signal associated with the repeating pattern in response to receiving the signal;
sample the signal and each of the one or more delayed signals generated at the one or more delay components along a rising edge of the inverted signal by storing a logic state determined from each sample at a respective flip-flop;
determine a first duration associated with a first portion of the signal in response to sampling the signal and each of the one or more delayed signals; and
swap a polarity of the signal to generate a second signal responsive to determining the first duration associated with the first portion of the signal.

10. The device of claim 9, wherein the TDC is further to:
delay the second signal one or more times at the one or more delay components in response to generating the second signal;
sample the second signal and each of the one or more delayed second signals generated at the one or more delay components along a rising edge of the inverted signal by storing a logic state determined from each sample at the respective flip-flop;
determine a second duration associated with a second portion of the signal in response to sampling the second signal and each of the one or more delayed second signals; and
determine a current duty cycle of the signal, the current duty cycle having the first duration and the second duration.

11. The device of claim 10, wherein the device further comprises a controller, and wherein the TDC is further to:
output the current duty cycle of the signal to the controller.

12. The device of claim 9, wherein the TDC is further to:
receive a control signal from a controller coupled to the TDC, wherein the TDC is to swap the polarity responsive to receiving the control signal.

13. The device of claim 12, wherein the TDC is further to;
deactivate a first switch coupling the signal to the one or more delay components responsive to receiving the control signal; and
activate a second switch coupling the signal to an inverter and the one or more delay components responsive to receiving the control signal, wherein the TDC is to generate the second signal responsive to activating the second switch.

14. The device of claim 9, wherein the first portion of the signal is associated with a current duty cycle of the signal.

15. A method, comprising:
performing, at a first device, an error distortion correction on a signal associated with a repeating pattern received from a link coupled with the first device, the error distortion correction comprising:
receiving, at one or more circuits, the signal at either one or more paths associated with transmitting data or one or more paths associated with transmitting a clock signal;
delaying the signal one or more times at one or more delay components of a time-to-digital converter (TDC);
determining, by sampling the signal and one or more delayed signals at the TDC, a current duty cycle of the signal, the current duty cycle having a first duration associated with a first portion of the signal and a second duration associated with a second portion of the signal;

determining that the current duty cycle fails to satisfy a condition associated with a target duty cycle in response to determining the current duty cycle of the signal; and adjusting the current duty cycle to obtain an adjusted duty cycle in response to the current duty cycle failing to satisfy the condition.

16. The method of claim 15, further comprising:

transmitting, from the TDC to a controller, the first duration associated with the first portion of the signal and the second duration associated with the second portion of the signal;

determine, at the controller, that the first duration is different than the second duration, wherein the first device is to determine the current duty cycle fails to satisfy the condition responsive to determining the first duration is different than the second duration; and transmitting a control signal to a circuit of the one or more circuits in response to determining the first duration is different than the second duration.

17. The method of claim 16, wherein the circuit comprises a complementary metal-oxide-semiconductor (CMOS), the method further comprising:

coupling an additional p-channel metal-oxide-semiconductor (PMOS) or an additional n-channel metal-oxide-semiconductor (NMOS) to an output of the CMOS responsive to transmitting the control signal to the circuit of the one or more circuits.

18. The method of claim 15, further comprising:

driving a second signal associated with the adjusted duty cycle through the one or more circuits responsive to adjusting the current duty cycle; and determining, at the TDC, the adjusted duty cycle of the second signal, the adjusted duty cycle having a first duration associated with a first portion of the second signal and a second duration associated with a second portion of the second signal.

19. The method of claim 18, further comprising:

correcting a distortion of the signal received by adjusting the current duty cycle of the signal received until a controller determines a first duration associated with a first portion of a respective signal is equal to a second duration associated with a second portion of the respective signal.

20. The method of claim 15, wherein receiving the signal associated with the repeating pattern across the one or more paths associated with transmitting data further comprises:

suspending the link; and refraining from receiving additional data across the one or more paths associated with transmitting data while receiving the signal.

* * * * *